(12) United States Patent
Koller et al.

(10) Patent No.: US 11,917,771 B2
(45) Date of Patent: Feb. 27, 2024

(54) METHOD FOR PRODUCING A HOUSING ENCLOSING A CONTROL UNIT

(71) Applicant: ZKW Group GmbH, Wieselburg (AT)

(72) Inventors: Jan Koller, Vienna (AT); Harald Graf, Würflach (AT)

(73) Assignee: ZKW Group GmbH, Wieselburg (AT)

( * ) Notice: Subject to any disclaimer, the term of this patent is extended or adjusted under 35 U.S.C. 154(b) by 155 days.

(21) Appl. No.: 17/613,342

(22) PCT Filed: May 22, 2020

(86) PCT No.: PCT/EP2020/064287
§ 371 (c)(1),
(2) Date: Nov. 22, 2021

(87) PCT Pub. No.: WO2020/244935
PCT Pub. Date: Dec. 10, 2020

(65) Prior Publication Data
US 2022/0225515 A1 Jul. 14, 2022

(30) Foreign Application Priority Data

Jun. 7, 2019 (EP) .................................. 19179010

(51) Int. Cl.
*B21D 53/02* (2006.01)
*H05K 5/00* (2006.01)
(Continued)

(52) U.S. Cl.
CPC ........... *H05K 5/0026* (2013.01); *B21D 53/02* (2013.01); *F21S 45/48* (2018.01); *H05K 5/04* (2013.01); *Y10T 29/49947* (2015.01)

(58) Field of Classification Search
CPC .................................. B21D 53/02; B21D 5/16
See application file for complete search history.

(56) References Cited

U.S. PATENT DOCUMENTS 5,365,410 A * 11/1994 Lonka .................. H05K 9/0026
174/382
5,865,531 A 2/1999 Frey et al.
(Continued)

FOREIGN PATENT DOCUMENTS

DE 102010041831 A1 4/2012

OTHER PUBLICATIONS

International Search Report for PCT/EP2020/064287 dated Jun. 16, 2020 (14 pages).
(Continued)

*Primary Examiner* — Sarang Afzali
(74) *Attorney, Agent, or Firm* — Eversheds Sutherland (US) LLP

(57) ABSTRACT

The invention relates to a method for producing a housing (7) enclosing a control unit (8) by mechanically forming a starting material (1), wherein the control unit (8) is configured to control particularly a vehicle headlight, comprising the following steps:
  a) providing an essentially strip-shaped, preferably metal starting material (1), wherein the starting material (1) is subdivided into at least three subareas (4, 5, 6) adjacent to one another, which are separated by fold axes (11, 13);
  b) forming cooling fins (4a) on a first subarea (4);
  c) forming a housing bottom (5a) on a second subarea (5);
  d) forming a housing cover (6a) on a third subarea (6);
  e) carrying out a folding operation, in which the first subarea (4) is folded about the first fold axis (11) onto the second subarea;
  f) attaching the control unit (8) to the second subarea (4) [sic];
  g) carrying out a folding operation, in which the third subarea (6) is folded about the second fold axis (13) onto the second subarea;

(Continued)

h) fixing the first subarea (4) to the second subarea (5) and fixing the second subarea (5) to the third subarea (6) with at least one fixing element (16).

13 Claims, 3 Drawing Sheets

(51) Int. Cl.
*F21S 45/48* (2018.01)
*H05K 5/04* (2006.01)

(56) References Cited

U.S. PATENT DOCUMENTS

| | | | | |
|---|---|---|---|---|
| 6,535,387 | B2* | 3/2003 | Summers | H05K 7/20509 |
| | | | | 361/720 |
| 6,870,739 | B2* | 3/2005 | Groos | H05K 5/04 |
| | | | | 361/725 |
| 7,095,626 | B2* | 8/2006 | Seidler | H05K 9/0026 |
| | | | | 361/818 |
| 7,312,998 | B2* | 12/2007 | Kamemoto | H05K 7/2049 |
| | | | | 165/185 |
| 9,287,032 | B1* | 3/2016 | Zweifel | H02G 3/10 |
| 2004/0240192 | A1 | 12/2004 | Seidler | |
| 2015/0373867 | A1* | 12/2015 | Ochoa Reyes | H05K 5/003 |
| | | | | 72/379.4 |

OTHER PUBLICATIONS

Search Report for European Patent Application No. 19179010.4 dated Dec. 12, 2019 (6 pages).

* cited by examiner

METHOD FOR PRODUCING A HOUSING ENCLOSING A CONTROL UNIT

The invention relates to a method for producing a housing enclosing a control unit by mechanically forming a starting material, wherein the control unit is configured to control particularly a vehicle headlight.

The invention also relates to a control module.

The invention furthermore relates to a vehicle headlight.

In the prior art, control units for vehicle headlights are usually enclosed by a housing. To dissipate the heat generated in the control unit, known housings are generally provided with cooling devices, for example cooling fins, on an outside of the housing. To this end, the cooling fins have to be connected to the housing, used for this purpose heat conductive adhesives, which have a certain curing time. Past approaches to optimize cooled housings for control units were directed at improvements in the selection of materials for the housing and cooling fins, variations in the housing size relative to the cooling fin size, or the use of fast-drying adhesives.

The problem underlying the present invention is how to provide a way to overcome the disadvantages of the prior art.

This problem is solved by the method according to the invention, which comprises the following method steps:
 a) providing an essentially strip-shaped starting material, which is preferably metallic and has an upper side and an underside, wherein the starting material is subdivided into at least three subareas adjacent to one another, which are separated by fold axes;
 b) forming cooling fins on a first subarea of the starting material (after step a);
 c) forming a housing bottom on a second subarea of the starting material, which preferably corresponds to a middle area of the starting material, wherein the starting material has a first fold axis (after step a) between the first subarea and the second subarea;
 d) forming a housing cover on a third subarea of the starting material, wherein the starting material has a second fold axis (after step a) between the second subarea and the third subarea;
 e) carrying out a folding operation, in which the underside of the first subarea of the starting material is folded about the first fold axis onto the underside of the second subarea of the starting material such that, in the folded state, the first subarea and the second subarea are essentially oriented congruently over each other, wherein the underside of the first subarea and the underside of the second subarea are in direct contact with each other, preferably at least partially in full-surface contact at least in sections thereof (after steps b and c);
 f) attaching the control unit, which is in particular configured to control a vehicle headlight, on the upper side of the second subarea of the starting material (after step c);
 g) carrying out a folding operation, in which the upper side of the third subarea of the starting material is folded about the second fold axis onto the upper side of the second subarea of the starting material, or performing a folding operation in which the underside of the third subarea of the starting material is folded about the second fold axis onto the upper side of the second subarea of the starting material such that, in the folded state, the second subarea and the third subarea are oriented substantially congruently over each other, wherein the housing bottom formed in step c) and the housing cover formed in step d) are configured in such a way that, in the folded state, a housing chamber enclosing the control unit is formed between the housing bottom and the housing cover (after step f);
 h) fixing the first subarea to the second subarea and/or fixing the second subarea to the third subarea with at least one fixing element such that the first subarea with the second subarea and/or the second subarea with the third subarea are connected to each other by the interaction of the fixing element(s) (after steps e) and g).

Unless stated otherwise, the chronological sequence of the method steps listed in claim 1 can be freely chosen. For example, the chronological sequence of the steps may be b, c, d, also b, d, c, or c, b, d, or c, d, b, or d, b, c, or d, c, b. As a starting material, for instance steel, stainless steel or aluminum may be envisaged. A person skilled in the art selects the starting material on the basis of whether the starting material can be plastically shaped and plastically folded without cracking. The starting material is preferably strip-shaped, wherein the starting material has, for example, a length of 25 cm to 75 cm, a width of 6 cm to 20 cm, and a thickness of 0.3 mm to 2 mm. At the fold axes, the starting material may have a reduced thickness in comparison to that of the first, second and third subareas in order to simplify the folding operations. The forming of the cooling fins on the first subarea of the starting material comprises in particular mechanical forming, for example pressing the first subarea against a corresponding contour. The forming of the housing bottom or housing cover on the second or third subarea, respectively, of the starting material includes, in particular, the forming of at least one recess on the second and/or third subarea, wherein the recess may have a shape which has a spatial extent which is at least equal to or greater than the spatial extent of the control unit. The folding operations according to steps e) and g) include mechanical folding of the starting material, wherein preferably a folding tool is applied to the corresponding fold axis and the folding operation is subsequently carried out. During this the starting material is plastically deformed. After the folding operation of step e), the cooling fins are preferably in direct contact, at least partially, with the housing bottom in order to achieve efficient cooling of the housing bottom. After the forming of the cooling fins, the housing bottom and the housing cover, the first, second and third subareas of the starting material preferably have the same length and/or width. The control unit may also be configured to control a vehicle motor, a vehicle transmission, the chassis of a vehicle or hydraulic devices, for example for construction equipment or farming equipment.

Preferably, the first subarea borders the second subarea and the second subarea borders the third subarea such that the second subarea is arranged between the first and the third subarea or the second subarea borders the first subarea and the first subarea borders the third subarea such that the first subarea is arranged between the second and the third subareas. In particular, the first subarea does not border the third subarea or the second subarea does not border the third subarea in the unfolded state.

The at least one fixing element may be realized as at least one folding tab, riveted connection, welded connection, catch connection or bonded connection. At least one drilled hole for the riveted connection may be drilled in the starting material before or after the folding operations. The at least one folding tab may be formed, for example, on an edge region of the first and/or second and/or third subarea. After the first and/or second folding operation, the at least one tab may be folded such that the at least one tab, which is formed on an edge region of a subarea, at least partially encloses another subarea after it has been folded. As an alternative to this, a catch connection may be provided, wherein at least one catch lug is formed on a subarea of the starting material, and a corresponding recess, in which the catch lug can engage, is formed on another subarea. When a subarea is folded onto another subarea according to steps e) and g), the catch lug can engage in the corresponding recess.

The at least one fixing element may in particular comprise a first and a second fixing elements, wherein the first fixing element fixes the first subarea to the second subarea and the second fixing element fixes the second subarea to the third subarea. The first and second fixing elements may be the same or different. A fixing element may also fix the first subarea to the third subarea such that the second subarea, which in the folded state of the starting material is arranged in a vertical direction between the first and the third subarea, is fixed in a sandwich-like manner by the first and the third subarea.

The second fixing element is preferably realized as a bonded connection, which fixes the housing bottom to the housing cover, and is configured to seal the housing chamber. In an advantageous manner, the housing cover can thus be fixed to the housing bottom and the housing is simultaneously sealed and thus protected from dirt. The bonded connection is preferably an adhesive layer, which for example is applied along an edge region of the second and/or third subarea of the starting material as a closed track of adhesive prior to the folding operation.

In particular, the method may comprise the following further step (chronologically) after step c) and prior to the attachment of the control unit according to step f):

applying a fill material between the control unit and the second subarea, wherein the fill material comprises a thermal grease, in particular a silicone-containing or silicone-free pasty thermal grease.

Advantageously, the dissipation of heat generated by the control unit may be enhanced by the thermal grease. In particular, the contact and the adhesion of the control unit to the second subarea may also be improved by the fill material.

The control unit preferably includes a circuit board with an electronic circuit mounted thereon for actuating the vehicle headlight, wherein the fill material is in particular applied between the circuit board and the second subarea.

In order to enable a particularly efficient dissipation of heat from the control unit to the cooling fins, it will be beneficial if the fill material has a thermal conductivity of greater than 1 W/mK, preferably greater than 5 W/mK, particularly preferably greater than 10 W/mK.

The starting material preferably comprises a metal strip, wherein the metal has mechanical properties which permit plastic and crack-free folding according to method steps e) and g).

The starting material preferably consists of a single metal strip. The housing of the control unit is thus advantageously made in essentially one piece. In other words, the cooling device, the housing bottom and the housing cover, which essentially form the housing, are made from a single metal strip. The production process can thus be carried out more economically and faster.

According to the invention, a control module including a control unit is provided, which particularly is configured to control a vehicle headlight, and a housing, wherein the housing is produced according to the method of the invention. The control unit may also be configured to control a vehicle motor, a vehicle transmission, the chassis of a vehicle or hydraulic devices, for example for construction equipment or farming equipment.

According to the invention, a vehicle headlight including the control module according to the invention is provided.

In the context of this description, the terms "above", "below", "horizontal", and "vertical" are to be understood as indications of the orientation merely when the vehicle headlight is disposed in the normal use position after it has been installed in the vehicle.

The invention shall be explained in more detail below with reference to a preferred, but non-limiting, exemplary embodiment. In the drawings.

Figure 1:
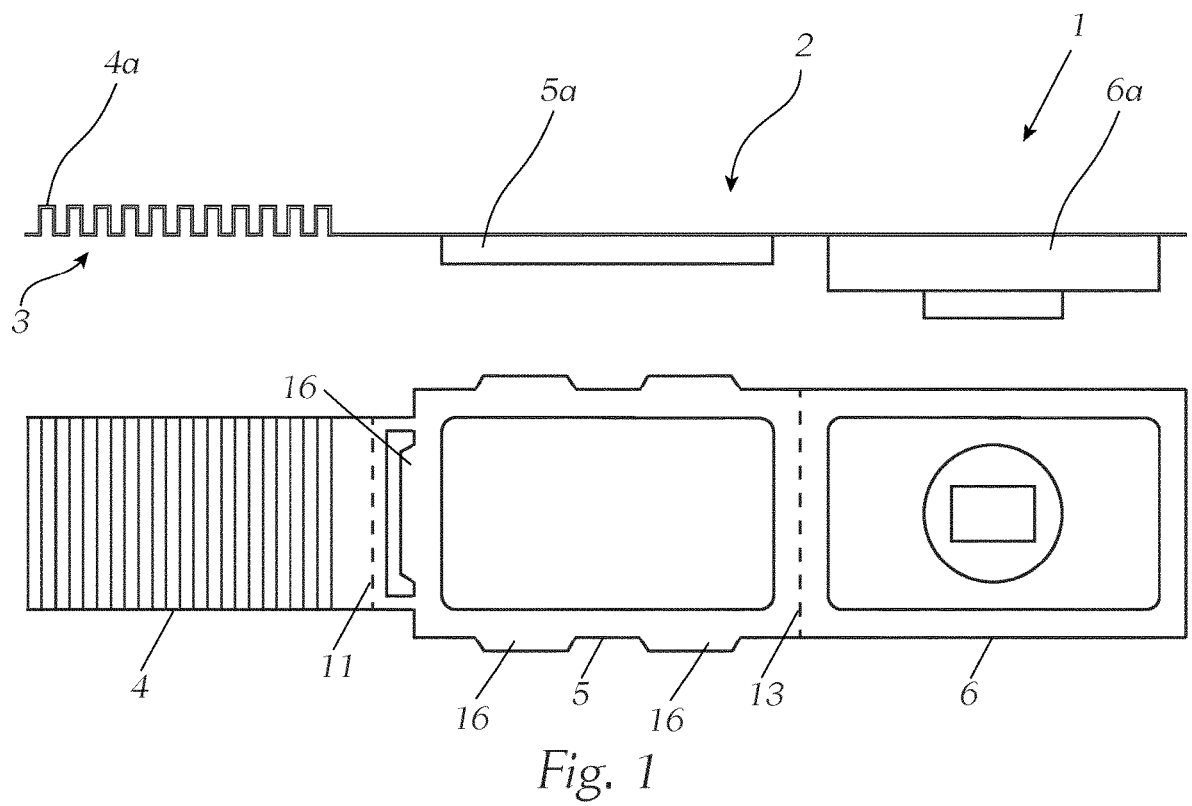
FIG. 1 shows a side view and a view from above of a starting material, which has a first, second and third subarea.

FIG. 1 shows an essentially strip-shaped, preferably metal starting material 1, which comprises an upper side 2 and an underside 3, wherein the starting material 1 is subdivided into three subareas 4, 5, 6, which in the exemplary embodiment shown are of equal size and adjacent to one another, separated by fold axes. The first subarea 4 borders the second subarea 5 and the second subarea 5 borders the third subarea 6 such that the second subarea 5 is located between the first 4 and the third subarea 6. The starting material 1 is converted by mechanical forming and folding into a housing 7 enclosing a control unit 8. To this end, the starting material 1 is preferably a metal strip, in which the metal has mechanical properties which permit plastic and crack-free forming and folding. In the illustrated exemplary embodiment, the starting material 1 consists of a single metal strip. Cooling fins 4a are formed on a first subarea 4 of the starting material 1, wherein the cooling fins 4a are formed by mechanical forming, for example by pressing the first subarea 4 against a corresponding contour. A housing bottom 5a is formed on a second subarea 5 of the starting material 1. The second subarea 5 corresponds to a middle area of the starting material 1, wherein the starting material 1 has a first fold axis 11 between the first subarea 4 and the second subarea 5. A housing cover 6a is formed on a third subarea 6 of the starting material 1, wherein the starting material 1 has a second fold axis 13 between the second subarea 5 and the third subarea 6. The housing bottom 5a and the housing cover 6a are formed by, for example, mechanically pressing the corresponding subareas against corresponding contours.

Figure 2:
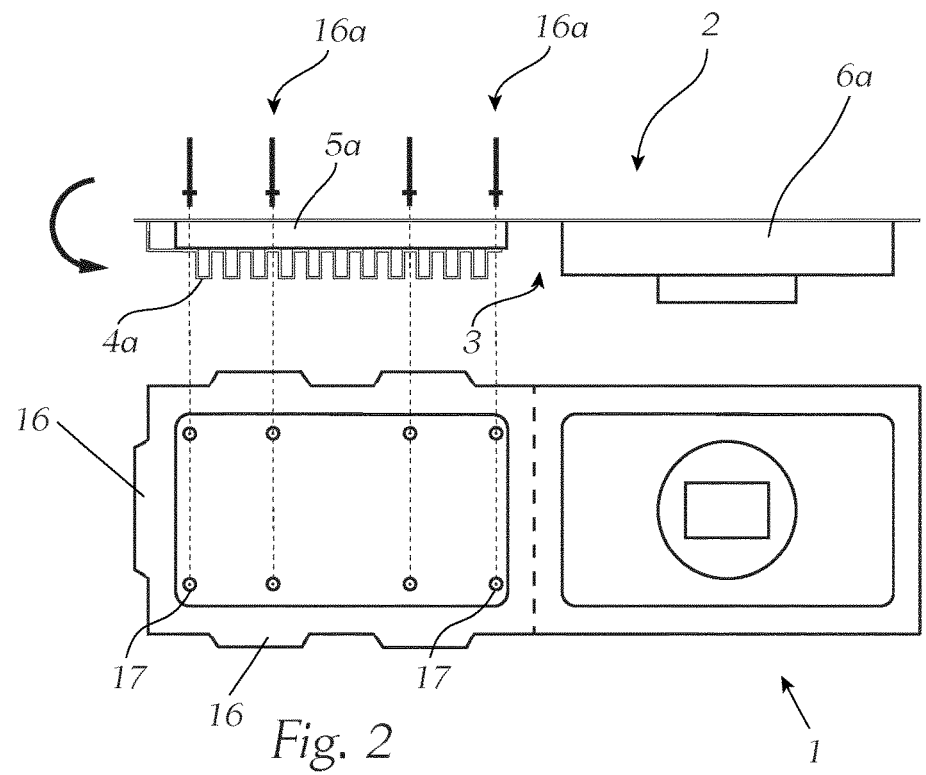
FIG. 2 shows a side view and a view from above of the starting material after the first folding operation.

FIG. 2 shows the starting material 1 after the first folding operation. The underside 3 of the first subarea 4 of the starting material 1 is folded about the first fold axis 11 onto the underside 3 of the second subarea 5 of the starting material 1. In the folded state, the first subarea 4 and the second subarea 5 are oriented lying essentially congruent over each other, wherein the underside 3 of the first subarea 4 and the underside 3 of the second subarea 5 are in direct contact with each other.

Figure 3:
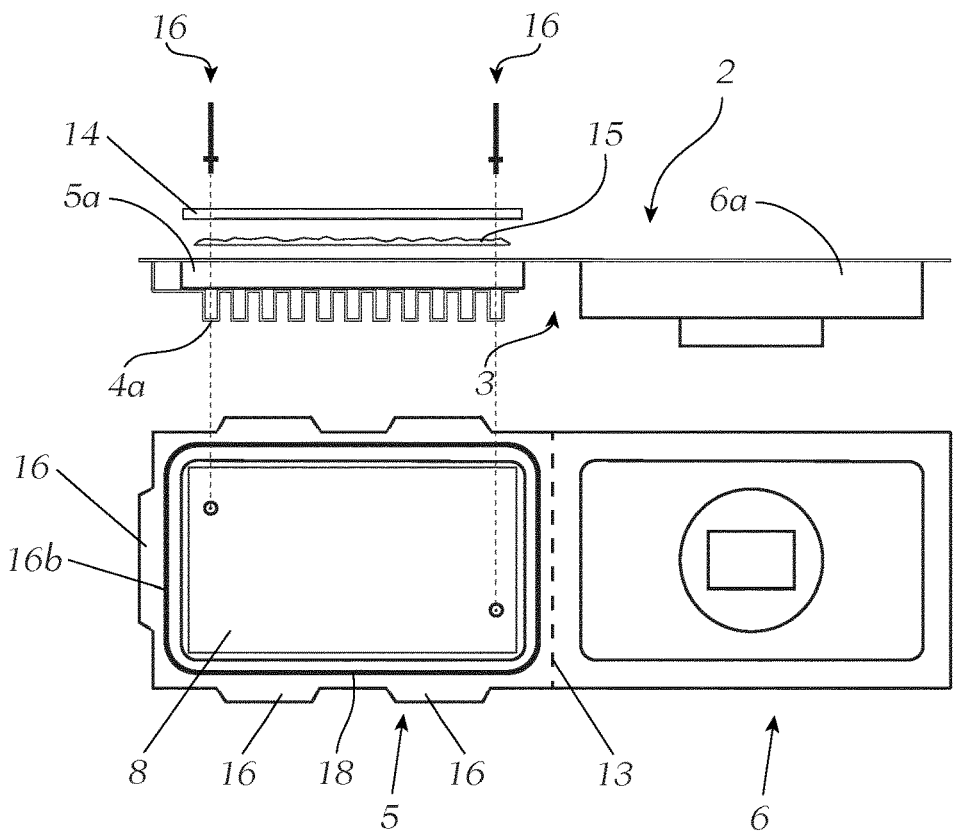
FIG. 3 shows a side view and a view from above of the starting material according to FIG. 2, having a control unit attached to the second subarea.

FIG. 3 shows the starting material 1 after method step f). A control unit 8, which is in particular configured to control a vehicle headlight, is fastened to the upper side 2 of the second subarea 5 of the starting material 1. The control unit 8 is fastened to the second subarea 5 using, for example, rivets or adhesive. The control unit 8 comprises a circuit board 14 with an attached electronic circuit (not shown) for actuating the vehicle headlight. A fill material 15 is applied between the circuit board 14 of the control unit 8 and the second subarea 5. The fill material 15 is a thermal grease, in particular a silicone-containing or silicone-free pasty thermal grease.

Figure 4:
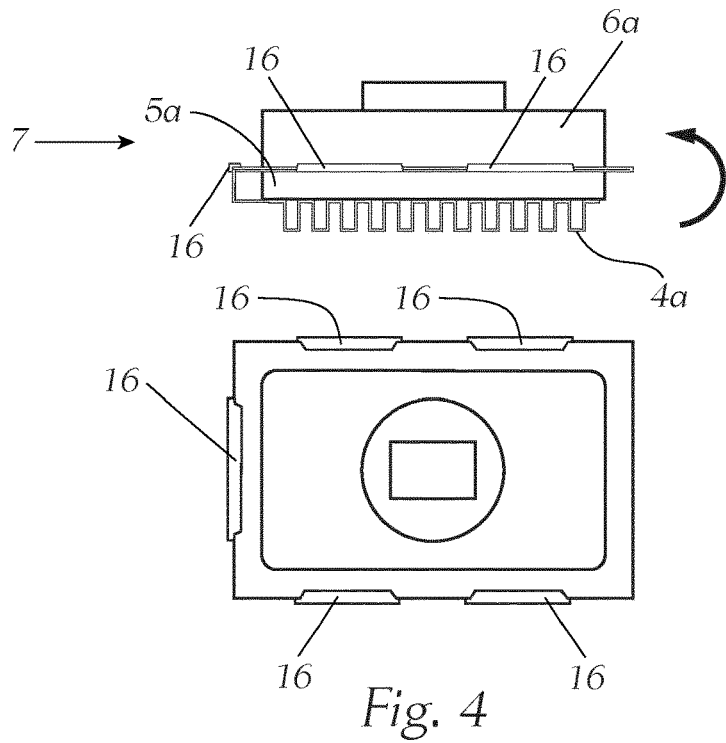
FIG. 4 shows a side view and a view from above of the starting material after the second folding operation.

FIG. 4 shows the starting material 1 after the second folding operation. The upper side 2 of the third subarea 6 of the starting material 1 is folded about the second fold axis 13 onto the upper side 2 of the second subarea 5 of the starting material 1. In the folded state, the second subarea 5 and the third subarea 6 are oriented essentially congruent over each other. The housing bottom 5a and the housing cover 6a are formed such that, in the folded state, a housing chamber enclosing the control unit 8 is realized between the housing bottom 5a and the housing cover 6a.

The first subarea 4 is fixed to the second subarea 5 with a first fixing element 16a (shown in FIG. 2). Also, the second subarea 5 is fixed to the third subarea 6 with a second fixing element 16b (shown in FIG. 3) such that the first subarea 4 with the second subarea 5 and the second subarea 5 with the third subarea 6 are firmly connected to one another by the interaction of the first 16a and second 16b fixing elements. The first 16a and second fixing elements 16b may be the same or different in design. In general, the fixing elements 16 may be configured as, for example, at least one folding tab, riveted connection, welded connection, catch connection or bonded connection. As can be seen in FIG. 2 the first fixing element 16a is configured as a riveted connection, wherein eight drilled holes 17 are provided for the rivets. As can be seen in FIG. 3 the second fixing element 16b is realized as a bonded connection, wherein the bonded connection extends as a closed adhesive track 18 along an edge region of the housing bottom 5a. Instead of or in addition to this, the adhesive track 18 may also be applied to the housing cover 6a. A fixing element 16 may also fix the first 4, second 5 and third subareas 6 to one another. For example, at least one drilled hole 17 for a riveted connection may be provided through all subareas 4, 5, 6.

Figure 5:
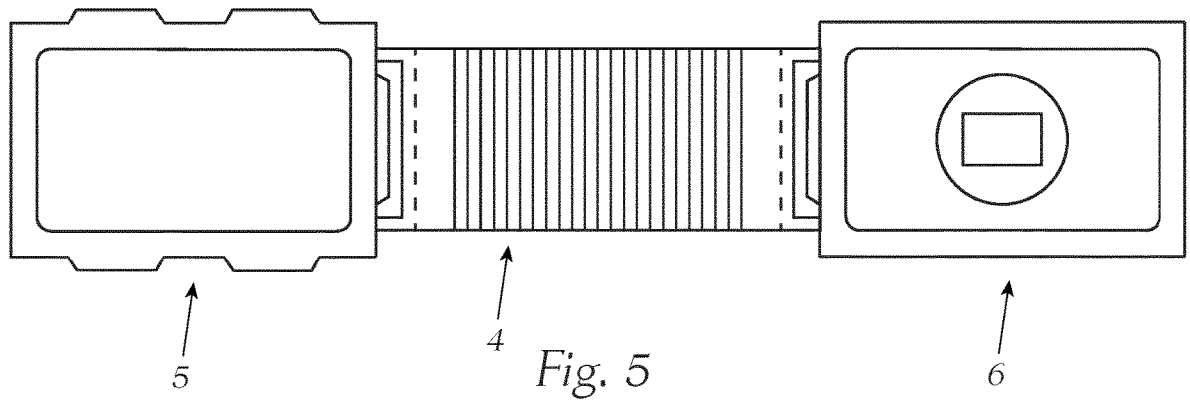
FIG. 5 shows a second embodiment of the starting material, which has a first, second and third subarea in an alternative arrangement.

FIG. 5 shows a second embodiment, in which the cooling fins 4a are arranged between the housing bottom 5a and the housing cover 6a. When the starting material 1 is folded, the underside 3 of the first subarea 4 of the starting material 1 is folded about the first fold axis 11 onto the underside 3 of the second subarea 5 of the starting material 1. In other words, the housing bottom 5a is folded onto the cooling fins 4a. In a second step, the underside 3 of the third subarea 6 of the starting material 1 is folded about the second fold axis 13 onto the upper side 2 of the second subarea 5 of the starting material 1. In other words, the housing cover 6a is folded onto the side of the housing bottom 5a that faces away from the cooling fins 4a.

Figure 6:
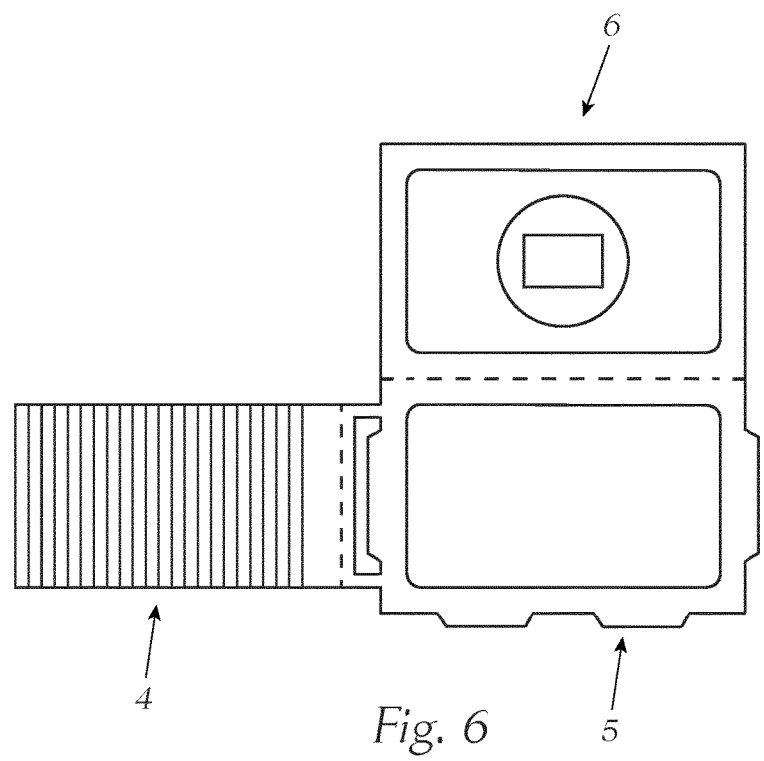
FIG. 6 shows a third embodiment of the starting material, which has a first, second and third subarea in another alternative arrangement.

FIG. 6 shows a further embodiment, in which the three subareas 4, 5, 6 of the starting material 1 are in an L-shaped arrangement.

REFERENCE SYMBOLS 1 starting material
2 upper side
3 underside
4 first subarea
4a cooling fins
5 second subarea
5a housing bottom
6 third subarea
6a housing cover
7 housing
8 control unit
11 first fold axis
13 second fold axis
14 circuit board
15 fill material
16 fixing element
16a first fixing element
16b second fixing element
17 drilled hole
18 track of adhesive

The invention claimed is:

1. A method for producing a housing (7) enclosing a control unit (8) by mechanically forming a starting material (1), the method comprising:
   a) providing an at least partially strip-shaped starting material (1) having an upper side (2) and an underside (3), wherein the starting material (1) is subdivided into at least three subareas (4, 5, 6) adjacent to one another, said subareas being separated by fold axes (11, 13);
   b) forming cooling fins (4a) on a first subarea (4) of the starting material (1);
   c) forming a housing bottom (5a) on a second subarea (5) of the starting material (1), which corresponds to a middle area of the starting material (1), wherein the starting material (1) has a first fold axis (11) between the first subarea (4) and the second subarea (5);
   d) forming a housing cover (6a) on a third subarea (6) of the starting material (1), wherein the starting material (1) has a second fold axis (13) between the second subarea (5) and the third subarea (6) or between the first subarea (4) and the third subarea (6);
   e) carrying out a folding operation, in which the underside (3) of the first subarea (4) of the starting material (1) is folded about the first fold axis (11) onto the underside (3) of the second subarea (5) of the starting material (1) such that, in a folded state, the first subarea (4) and the second subarea (5) are oriented to be at least partially congruent over each other, wherein the underside (3) of the first subarea (4) and the underside (3) of the second subarea (5) are in direct contact with each other;
   f) attaching the control unit (8), which is configured to control a vehicle headlight, to the upper side (2) of the second subarea (5) of the starting material (1);
   g) carrying out a folding operation in which the upper side (2) of the third subarea (6) of the starting material (1) is folded about the second fold axis (13) onto the upper side (2) of the second subarea (5) of the starting material (1), or a folding operation in which the underside (3) of the third subarea (6) of the starting material (1) is folded about the second fold axis (13) onto the upper side (2) of the second subarea (5) of the starting material (1), such that, in the folded state, the second subarea (5) and the third subarea (6) are oriented at least partially congruently over each other, wherein the housing bottom (5a) formed in step c) and the housing cover (6a) formed in step d) are configured such that, in the folded state, a housing chamber enclosing the control unit (8) is formed between the housing bottom (5a) and the housing cover (6a); and h) fixing, with at least one fixing element (16), at least one of the first subarea (4) to the second subarea (5) and the second subarea (5) to the third subarea (6).

2. The method according to claim 1, wherein the first subarea (4) borders the second subarea (5) and the second subarea (5) borders the third subarea (6), the second subarea (5) being located between the first (4) and the third subarea (6), or the second subarea (5) borders the first subarea (4) and the first subarea (4) borders the third subarea (6), the first subarea (4) being located between the second (5) and the third subarea (6).

3. The method according to claim 1, wherein the at least one fixing element (16) is realized as one or more folding tabs, a riveted connection, a welded connection, a catch connection, or a bonded connection.

4. The method according to claim 1, wherein the at least one fixing element (16) comprises a first (16a) and a second fixing element (16b), wherein the first fixing element (16a) fixes the first subarea (4) to the second subarea (5) and the second fixing element (16b) fixes the second subarea (5) to the third subarea (6).

5. The method according to claim 4, wherein the second fixing element (16b) is realized as a bonded connection, fixing the housing bottom (5a) to the housing cover (6a) and being configured to seal the housing chamber.

6. The method according to claim 1, wherein, after step c) and prior to the attaching of the control unit (8) according to step f), the method further comprises applying a fill material (15) between the control unit (8) and the second subarea (5), wherein the fill material (15) comprises a thermal grease.

7. The method according to claim 6, wherein the control unit (8) comprises a circuit board (14) with an electronic circuit mounted thereon for actuating the vehicle headlight, wherein the fill material (15) is applied between the circuit board (14) and the second subarea (5).

8. The method according to claim 6, wherein the fill material (15) has a thermal conductivity of greater than 1 W/mK.

9. The method according to claim 6, wherein the thermal grease is a silicone-containing or silicone-free pasty thermal grease.

10. The method according to claim 1, wherein the starting material (1) includes a metal strip, the metal strip having mechanical properties which permit plastic and crack-free folding operations during method steps e) and g).

11. The method according to claim 1, wherein the starting material (1) consists of a single metal strip.

12. The method according to claim 1, wherein the starting material (1) is metallic.

13. The method according to claim 1, wherein the underside (3) of the first subarea (4) and the underside (3) of the second subarea (5) are in full-surface contact in at least sections thereof.

\* \* \* \* \*